Feb. 23, 1971 D. D. BAUMANN 3,566,281

ELECTRIC PULSE WAVE CLIPPING CIRCUITRY

Filed May 21, 1968

5 Sheets-Sheet 1

INVENTOR.
DONALD D. BAUMANN

BY George E. Haus

ATTORNEY

Feb. 23, 1971 D. D. BAUMANN 3,566,281

ELECTRIC PULSE WAVE CLIPPING CIRCUITRY

Filed May 21, 1968 5 Sheets-Sheet 2

United States Patent Office 3,566,281
Patented Feb. 23, 1971

3,566,281

ELECTRIC PULSE WAVE CLIPPING CIRCUITRY

Donald Dennis Baumann, Los Gatos, Calif., assignor to International Business Machines Corporation, Armonk, N.Y., a corporation of New York Filed May 21, 1968, Ser. No. 730,695
Int. Cl. H03k *5/08;* H03b *3/02*
U.S. Cl. 328—171 12 Claims

ABSTRACT OF THE DISCLOSURE

Within limits each pulse of an input electric pulse wave sets the clipping level of the clipping circuitry to which that pulse is applied. A squared output electric pulse wave is developed in an overdriven differential amplifier circuit. The input circuitry of this differential amplifier operates to clip the input electric pulse wave applied to one input terminal in accordance with clipping level voltages applied to the other input terminal. The clipping level voltage is derived from the input electric pulse wave in a network having positive and negative peak detecting circuits coupled to a mixing circuit. The output of the mixing circuit is a dynamic clipping level voltage which is applied to the differential amplifier. The input electric pulse wave is delayed before application to the differential amplifier circuit to provide time for the generation of the clipping voltage. Cross coupling between the peak detecting circuits effects resetting of each other after each pulse is detected in readiness for the development of a new clipping level voltage for the succeeding input pulse.

Figures 1, 3, 5:
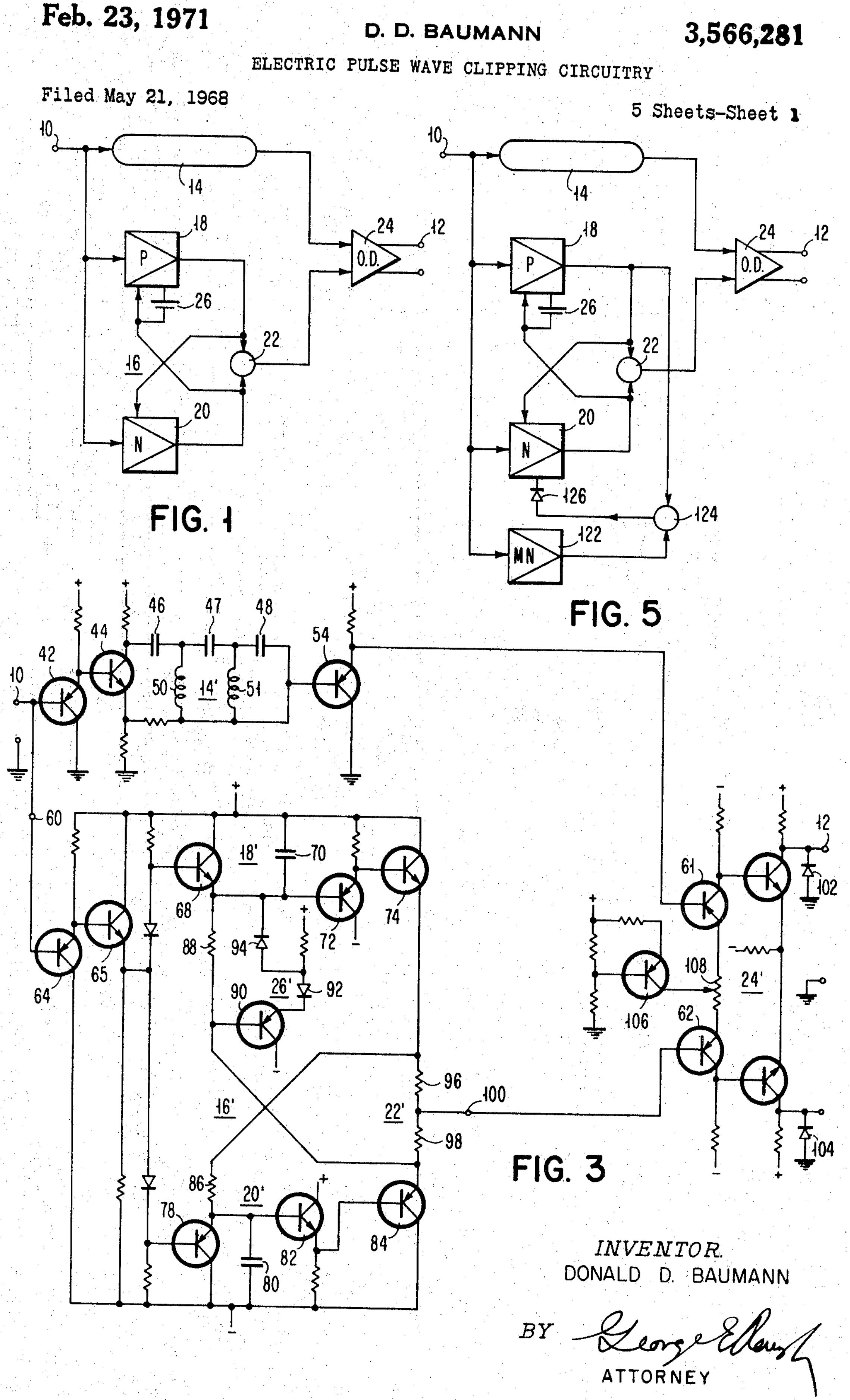

A long time constant negative peak detecting circuit and a further mixing circuit are incorporated in an extended embodiment for applying a voltage to the basic negative peak detecting circuit preventing it from restoring above a voltage developed in the further mixing circuit from the long time constant and the positive peak detecting circuit. Thus, waves of pulses of steadily ascending amplitude are clipped without loss of fidelity.

The invention relates to electric pulse wave clipping circuitry. It particularly pertains to circuitry for quantizing analog signals appearing in a varying background level to bistatic signals with uniform background level. The invention is particularly applicable, but not limited to optical scanning of documents and/or microimages.

In conventional systems of the type to which the invention applies, clipping circuits are used having the clipping level automatically set to the average input level of the composite signal. Frequently the clipping level is set at some definite percentage of the composite signal level. There are schemes which automatically set the threshold of optical systems in accordance with the print contrasts determined during the last preceding pulse. Still other arrangements set the level of the clipping by factors determined from both the preceding and the succeeding signals in the pulse wave. Where the pulses under consideration occur at regular time intervals, circuitry is available for clipping the pulses in accordance with the true mean level of the signals themselves as distinguished from background pulses. Although related only in the broad sense, there are circuits in the prior art which have variable thresholding circuitry for eliminating noise from the output signal. More detailed discussions of these prior art arrangements are found in the following United States patents and publications:

| | | | |
|---|---|---|---|
| 2,855,513 | 10/1958 | Hamburgen et al. | 250—27 |
| 2,975,371 | 3/1961 | Greanias | 328—168 |
| 2,985,839 | 5/1961 | Brown | 328—169 |
| 3,076,145 | 1/1963 | Copeland et al. | 328—165 |

| | | | |
|---|---|---|---|
| 3,130,371 | 4/1964 | Copeland | 328—54 |
| 3,174,061 | 3/1965 | Aldridge et al. | 307—88.5 |
| 3,278,851 | 10/1966 | Damon, Jr. et al. | 328—34 |

IBM Technical Disclosure Bulletin, vol. 8, No. 4, August 1965, Kennedy, pp. 692–693

According to the invention, the objects indirectly referred to hereinbefore and those which will appear as the specification progresses are attained in electric pulse wave clipping circuitry which sets the clipping level on elevating the very pulse which is being clipped. The input analog electric pulse wave accompanied by varying background level is applied to two channels. The wave is maintained intact but delayed in one channel for gaining sufficient time in which to develop a clipping level voltage in the other channel. In the latter channel the input wave is subjected to positive and negative peak detection and the derived positive peak and negative peak signals are algebraically summed. The resultant sum signal is compared to the delayed analog signal resulting in a clipped bistatic pulse wave. The input signal thereby sets within limits a near optimum clipping level for clipping the very pulse under consideration.

Circuitwise, the one channel comprises an all pass delay network and the other channel two peak detecting circuits coupled to a mixing circuit. The output of the delay network is applied to one input terminal of a differential amplifier circuit and the output of the mixing circuit is applied to the other input terminal of the differential amplifying circuit. The clipping is then effected in the input stage of the differential amplifying circuit. The latter may have circuitry enhancing the waveform such as an ovedriven stage or an output voltage limiting circuit or both.

After a pulse has been processed, each peak detecting circuit is restored to a relatively quiescent level by the instantaneous voltage of the opposite detecting circuit output in a sort of boot-strapped arrangement. This provides for clipping identical signal amplitudes differing only in absolute level in the same way.

In order to eliminate noise from the output when scanning large regions of background, a minimum threshold level is set for the positive peak detecting circuit which prevents it from restoring all the way to the negative level. Thus, for slowly varying inputs the clipping level voltage will always be somewhat more positive than the background. This technique, then, establishes the background level as a predominant voltage level toward which the positive voltage excursions return but never reach.

When large regions of opposite polarity to background are scanned, distortion may obtain with the circuit according to the invention as thus far described because the negative peak detecting circuit will restore toward the positive level as though this level were the new background level. Accordingly, an extension circuit of the invention comprises three peak detecting circuits and two mixing circuits. In addition to the two peak detecting circuits and mixing circuit described hereinbefore, a long time constant negative peak detector is arranged to hold the most negative level of inputs received for the duration of the entire scan and through the second mixing circuit apply that voltage as a threshold to the negative peak detecting circuit. This circuit is reset every time a new document is scanned so that each document sets its own most negative level. The operation of this further arrangement is as before except that the output of the positive peak detecting circuit in addition to being mixed with the output of the negative peak detecting circuit, is mixed with the output of the most negative peak detecting circuit and is used to establish a voltage above which the negative peak detecting circuit cannot restore. In this manner, large opposite polarity regions may be scanned while maintaining the quantized output fidelity.

Still further, according to the invention, the threshold voltage is made a function of the output of the negative peak detecting circuit for greatly increasing the circuit sensitivity without introducing background noise in the output. Thus, when the background is very dark, the threshold voltage can be small since the noise voltage is small. Hence, small amplitude bits can be detected. If the background is gray, the threshold voltage must be higher since the background signal is higher, as is the noise component in the signal. Circuitry similar to automatic gain control circuitry is used for automatic threshold control between the negative and positive peak detecting circuits.

Figure 2:
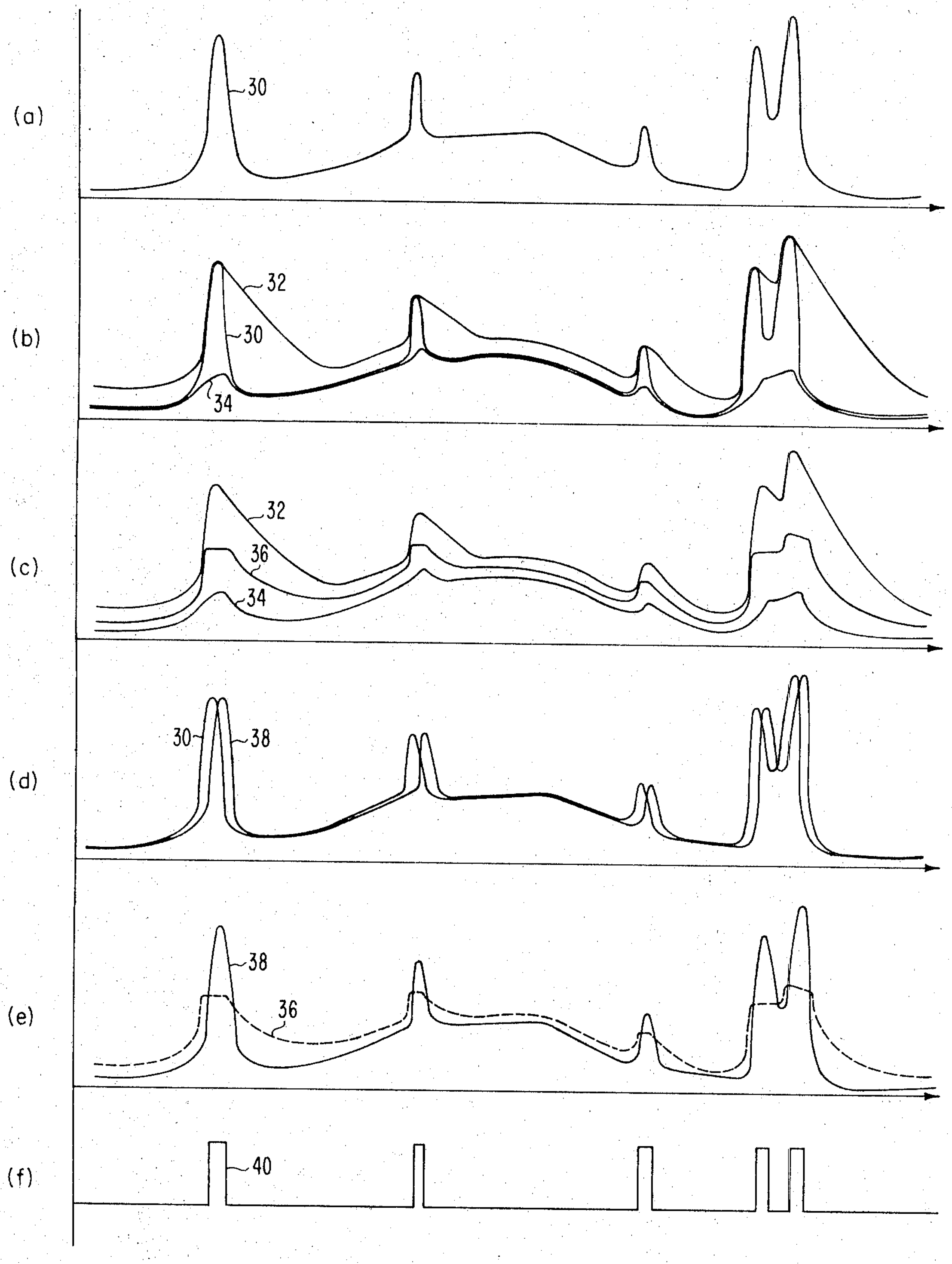
Figure 4:
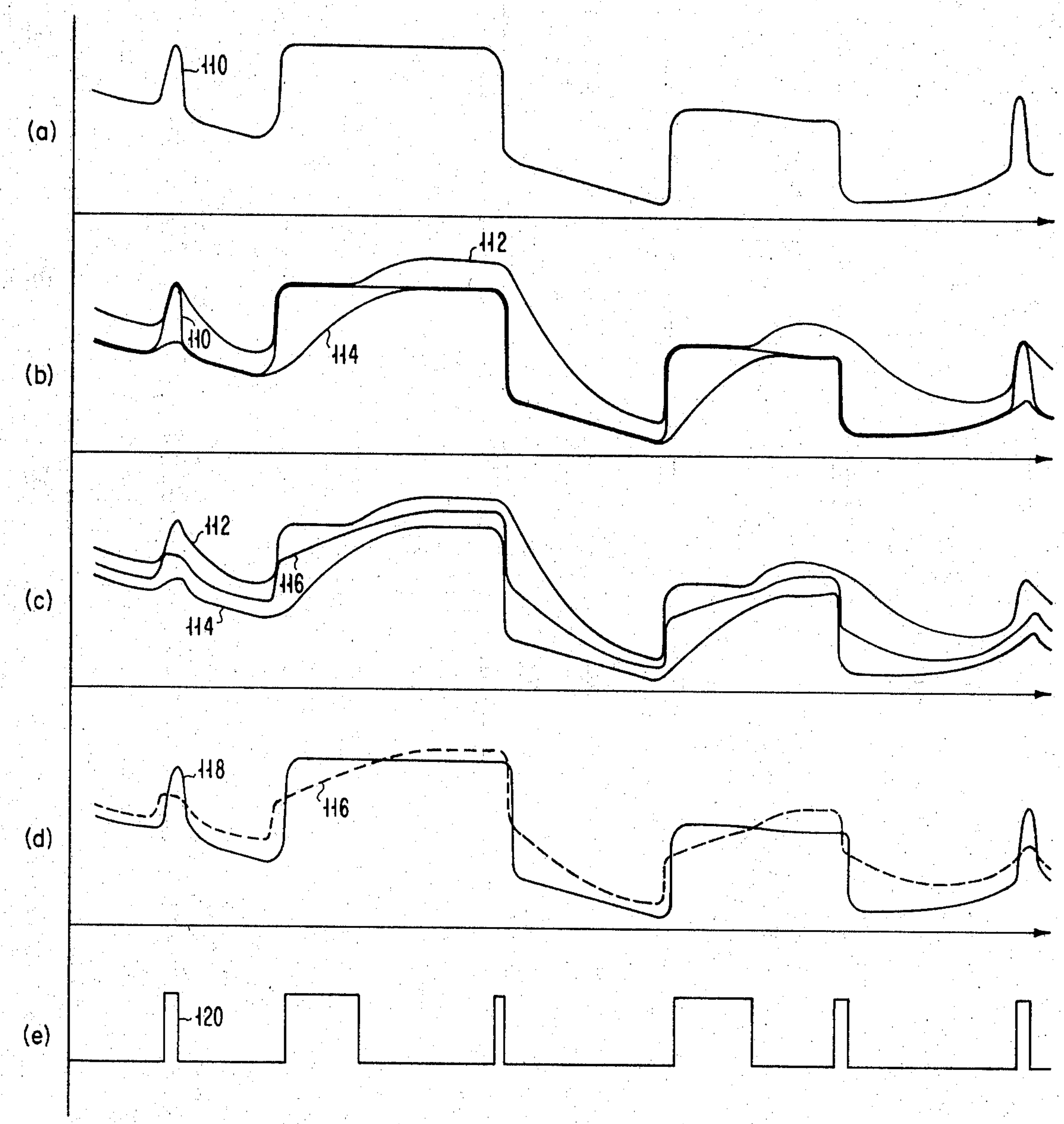
Figure 6:
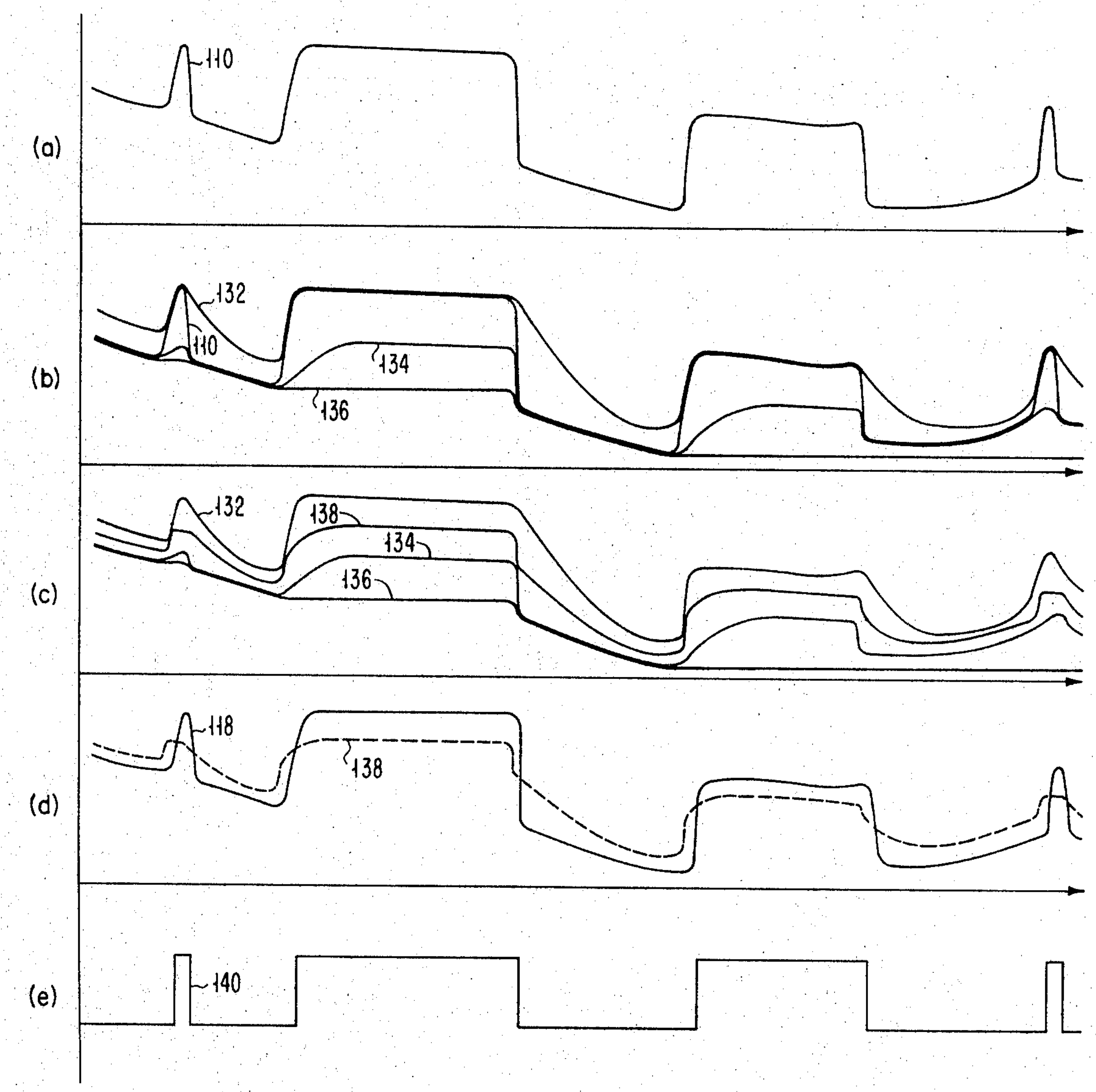
Figure 7:
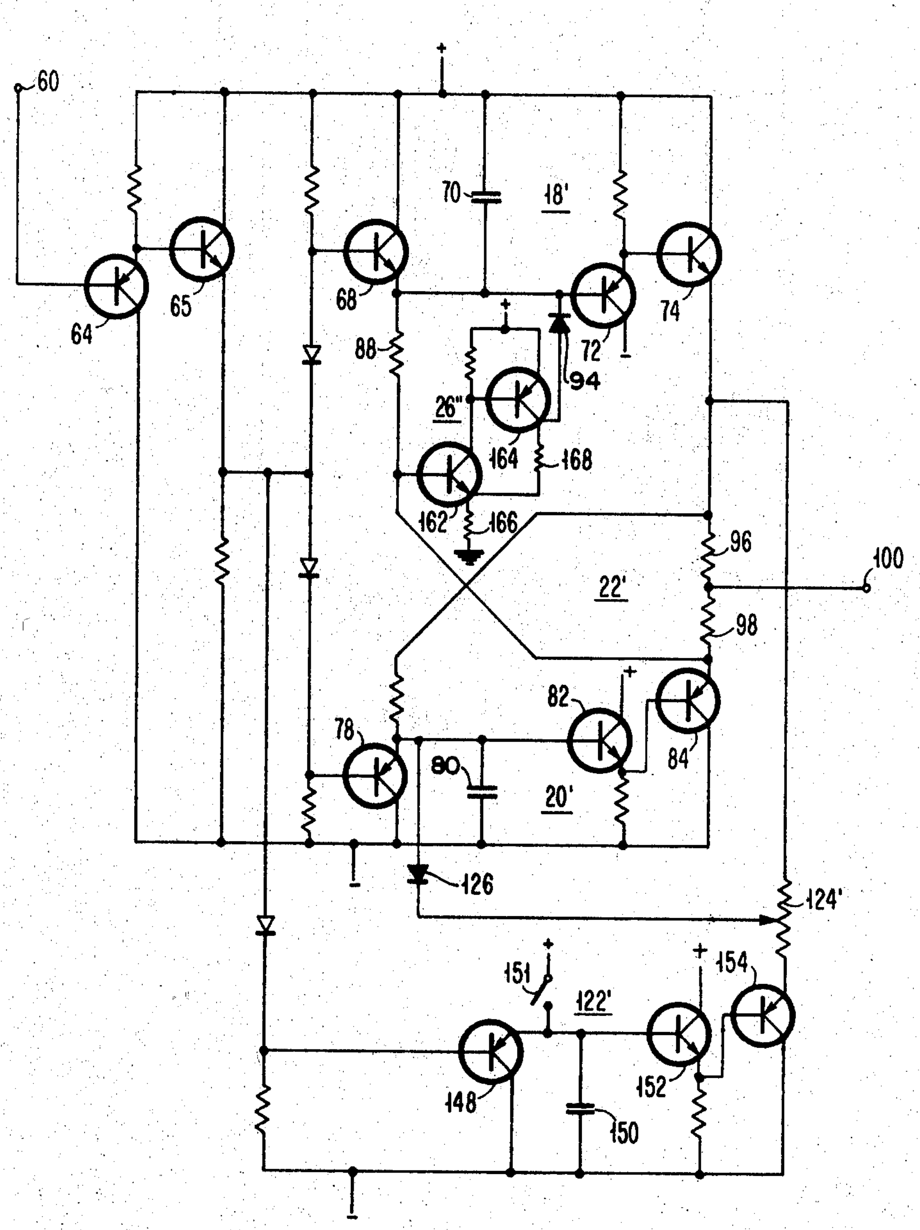

In order that full advantage of the invention may be obtained in practice, preferred embodiment thereof, given by way of examples only, are described in detail hereinafter with reference to the accompanying drawing, forming a part of the specification and in which:

FIG. 1 is a functional diagram of a basic embodiment of the invention;

FIG. 2 (sections (*a*) through (*f*) being taken together) is a graphical representation of waveforms obtained in the arrangement of FIG. 1;

FIG. 3 is the schematic diagram of an example of circuitry for performing the functions outlined in FIG. 1;

FIG. 4 (sections (*a*) through (*e*) being taken together) is a graphical representation of waveforms explanatory of the operation of circuitry according to the invention under certain conditions;

FIG. 5 is a functional diagram of a further embodiment of the invention;

FIG. 6 (sections (*a*) through (*e*) being taken together) is a graphical representation of waveforms obtained in the arrangement of FIG. 5; and FIG. 7 is a schematic diagram of an example of circuitry performing the functions of the invention as outlined in FIG. 5.

FIG. 1 depicts a basic embodiment of the invention. A video analog pulse wave signal, for example, that obtained from an optical type document scanning device, is applied to input terminals 10 in order to produce a corresponding bistatic electric pulse wave at output terminals 12. The video input signal is channeled into two paths comprising an all pass delay network 14 and a clipping level determining network 16. The latter comprises a positive peak detecting circuit 18 and a negative peak detecting circuit 20, both of which are coupled to a mixing circuit 22. The delayed video signal is applied to one terminal of a differential amplifier 24 preferably one having at least one overdriven stage. The output of the summing or mixing circuit 22 which constitutes the clipping level voltage is applied to the other input terminal of the differential amplifier 24 for comparison against the delayed analog video signal. Circuitry, represented here as a cell 26, preferably is provided for setting a minimum threshold level preventing the positive peak detecting circuit 18 from restoring all the way to the negative level. Connections from the output of each of the detecting circuits are cross connected to the other detecting circuits for restoring each other after each pulse has been processed.

Referring to FIG. 2, there is shown a series of graphical representations of waveforms obtained with the arrangement of FIG. 1. The same reference numeral is used each time a particular waveform is shown. The input video analog pulse wave is shown by the curves 30 in FIGS. 2(*a*), 2(*b*), and 2(*d*). The output of the positive peak detecting circuit 18 is represented by the curve 32, while the output of the negative peak detecting circuit 20 is shown by the curve 34. FIG. 2(*b*) shows these curves in relationship to the input video wave and FIG. 2(*c*) shows them in relationship to a curve 36 representing the clipping level voltage as obtained at the output of the mixing circuit 22 and then as applied to the clipping input terminal of the amplifying circuit 24. The delayed video signal is represented by curve 38 as compared to the input video signal curve 30 in FIG. 2(*d*) and against the clipping level voltage 36 in FIG. 2(*e*). The output bistatic pulse wave at the output terminal 12 is represented by the curve 40 in FIG. 2(*f*).

FIG. 3 is a schematic diagram of an embodiment of the invention for performing the functions outlined in the above description of FIGS. 1 and 2. Like reference numerals have been used for like components. Primed referenced numerals correlated schematic circuitry with functional symbols.

The input video analog pulse wave at the input terminals 10 is applied to a video input buffer transistor 42 which is coupled to a paraphase amplifier transistor 44. The latter drives the delay network 14' comprising series capacitors 46, 47 and 48 and shunt inductors 50 and 51 of values delaying the input signal for all frequencies for a time period slightly longer than the rise time for the pulses making up the video signal. In a practical application in an optical type document scanner, sufficient time was found to be five microseconds. The output of the delay network 14' is applied through an amplifying transistor 54 to one of a pair of input transistors 61 and 62 of a differential amplifier 24'.

The input video analog signal is also applied at terminals 60 to the clipping voltage generating circuitry 16' through a buffer amplifier comprising a pair of transistors 64 and 65, the latter of which is connected in conventional emitter follower circuit configuration. The positive peak detecting circuit 18' comprises a transistor 68 and a capacitor 70. The voltage across the positive peak charging capacitor 70 is repeated by transistors 72 and 74. The negative peak detecting circuit 20' is similar in configuration with transistor 78 and capacitor 80. The voltage across the capacitor 80 representing negative peak is repeated by transistors 82 and 84. The positive peak output at the emitter of the repeater transistor 74 is applied to a resistor 86 to the negative peak detecting circuit 20' for restoring the latter after processing the pulse under consideration. A similar resistor 88 couples the output of the negative peak detecting circuit 20' at the transistor 84 to the positive peak detecting circuit 18' for restoring the latter. The recovery time constant of each of the peak detecting circuits is related to the attack time of the succeeding video pulse. In a practical application, the time is of the order of approximately eighty to one hundred microseconds as determined by the values of the capacitors 70 and 80 and the resistors 88 and 86, respectively. The minimum threshold level for the positive peak detecting circuit 18' is set by means of a circuit 26' comprising a transistor 90 and diodes 92 and 94. The output voltages of the detecting circuits at transistors 74 and 84 are applied to the summing or mixing circuit 22' which comprises a simple resistive adder network having but two resistors 96 and 98. The output of mixing circuit 22' at the terminal 100 is applied to the base of the other input transistor 62 of the amplifier 24'.

The differential amplifying circuit 24' may be entirely conventional, but preferably is a squaring amplifier circuit for perfecting the wave shape of the output pulse train. It may have one or more overdriven stages for this purpose or output voltage limiting circuitry, or both. A pair of diodes 102 and 104 are arranged to prevent the output signal from swinging below ground level. A constant current regulating transistor 106 and a balancing potentiometer 108 are preferably incorporated in the circuitry.

The actual amplitude of the delayed signal wave 38 at the point where it is to be clipped can be varied by varying the ratio of the mixing resistors 96 and 98. When the resistors 96 and 98 are of equal value, the video pulses are clipped at 50% amplitude level. After a pulse is passed, each peak detecting circuit 18' and 20' is restored to a relatively quiescent level by the instantaneous voltage of the opposite detector output. This allows identical signal amplitudes differing only in absolute level to be clipped the same way. That is an incoming pulse varying from +1 to +2 volts is clipped in the same manner as does one varying from +2 volts to +3 volts, the signal amplitude in each case being 1 volt.

When large regions of opposite polarity field background are scanned, for example when scanning along a line in an engineering drawing, distortion will show in the output wave. This is because the negative peak detecting circuit will restore toward the positive level as though this were the new background. The waveforms in FIG. 4 illustrate this. The input video analog pulse wave is represented by curve 110 in FIGS. 4(*a*) and 4(*b*). The waveforms 112 and 114 represent the output of the positive peak detecting circuit 18 and the negative peak detecting circuit 20, respectively, in FIGS. 4(*b*) and (*c*). The described circuit will then produce the clipping level voltage represented by the curve 116 in FIGS. 4(*c*) and 4(*d*). In the latter figure, the curve 118 represents the delayed analog voltage as applied to the input terminal of the amplifying circuit 24. It can now be seen from the waveform 120 in FIG. 4(*e*) that the longer duration pulses of the input video analog pulse wave 110 are not properly represented in the final output pulses train.

This drawback is overcome with the modified circuit arrangement shown in FIG. 5. A long time constant most-negative peak detecting circuit 122 detects and holds the most-negative level of input analog video signal received for the duration of the entire scan. The output of the most-negative peak detecting circuit 122 is applied to another summing or mixing circuit 124 along with output from the positive peak detecting circuit 18. The composite of these two output waves is applied by means of a unilateral impedance device 126 to the negative peak detecting circuit 20 to apply a voltage above which the negative peak detecting circuit 20 cannot restore. Now large opposite polarity regions can be scanned while maintaining a quantized output fidelity.

FIG. 6 illustrates the operation of the modified circuit on the same input video analog pulse wave represented by thec urve 110. The wave 132 in FIGS. 6(*b*), 6(*c*) represents the output of the positive peak detecting circuit in the modified arrangement and curve 134 represents the negative peak detecting circuit output, while curve 136 represents the most negative peak detecting circuit output. The resultant output wave of the mixing circuit 22 is represented by curve 138 in FIGS. 4(*c*) and 4(*d*). In the latter figure, the delayed input voltage 118 is compared with the clipping level voltage represented by the curve 138. From the application of these latter waves to the differential amplifying circuit 24 the output pulse wave represented by the curve 140 in FIG. 6(*e*) very closely represents the input video analog pulse wave 110 in bistatic form as desired.

FIG. 7 is a schematic diagram of an example of clipping level voltage generating circuiting for performing the functions of the circuitry shown in FIG. 5. The circuitry between the clipping level generator circuit input terminal 60 and the output terminal 100 of the mixing circuit 22 differs mainly in the addition of the most-negative peak detecting circuit 122', the second mixing circuit 124' and the unilateral impedance device 126. The most-negative peak detecting circuit 122' comprises a transistor 148 and a capacitor 150. The time constant of the circuit 122' is the product of the values of the capacitor 150 and the leakage resistance. The latter is maintained as high as possible in order to have as long a time constant as possible. Restoration of the circuit 122' is accomplished by closing a switch 151 thereby charging the capacitor to a positive level. This switch 151 is preferably part of or controlled by the document scan initiating switch (not shown). The most negative peak voltage across the capacitor 150 is applied by means of transistors 152 and 154 to a terminal of a potentiometer 124' constituting mixing circuitry. The other terminal of the mixing potentiometer 124' is connected to the output of the positive peak detecting circuit 18' at the emitter of transistor 74. The mixing circuit potentiometer 124' permits ready adjustment of the clipping level for each document scanned by adjustment of the potentiometer arm. This potentiometer is preferred since the variation between documents may be quite large which would require the resetting of the clipping level ratio from document to document.

For document scanning with a multiplier phototube, variable thresholding is advantageous. The output shot noise of a multiplied phototube increases with absolute signal level. The amplitude sensitivity of the clipping circuitry according to the invention is a function of this threshold; that is, the signal must have an amplitude above the threshold in order to be clipped. Therefore, the threshold is made a varying function of the output of the negative peak detector 20 for increasing the circuit sensitivity without introducing background noise in the output. Thus, for dark background the threshold voltage is low since the noise is low and low amplitude pulses are readily detected. For gray background, the threshold must be high since the background signal is high along with noise in the signal. Such an arrangement is had by replacing the steady threshold voltage generating circuitry 26 with an automatic gain controlling type of circuit 26'' as shown in FIG. 7, comprising a pair of transistors 162, 164 and resistors 166, 168, having a definite gain proportional to the output of the negative peak detecting circuit 20 and the required threshold of the positive peak detecting circuit 18. In an actual case the gain is 1.1 to 1.5.

The circuitry described is arranged for scanning dark lines or areas against a light background. Light areas against a dark background may readily be scanned by inverting the input wave to the input terminals 10.

While the invention has been shown and described particularly with reference to preferred embodiments thereof, and various alternations have been suggested, it should be understood that those skilled in the art may effect still further changes without departing from the spirit and the scope of the invention as defined hereinafter.

The invention claimed is:

1. Electric pulse wave clipping circuitry, comprising:
- input terminals to which an electric pulse wave signal is applied,
- outside terminals at which a clipped pulse wave signal is desired,
- a positive peak detecting circuit coupled to said input terminals for determining the positive-most level of electric pulse wave signal,
- a negative peak detecting circuit coupled to said input terminals for determining the negative-most level of said electric pulse wave signal,
- an algebraic summing circuit coupled to said positive and said negative peak detecting circuits for generating a clipping level voltage,
- an electric time delay circuit coupled to said input terminals for delaying said electric pulse wave signal, and
- a signal translating circuit coupled to said electric time delay circuit, to said output terminals and to said summing circuit for modifying the delayed electric pulse wave signal in accordance with said clipping level voltage and delivering a clipped pulse wave signal at said output terminals.

2. Electric pulse wave clipping circuitry as defined in claim 1 and wherein
- said signal translating circuit is a differential amplifier circuit.

3. Electric pulse wave clipping circuitry as defined in claim 2 and wherein
- said differential amplifier circuit is overdriven.

4. Electric pulse wave clipping circuitry as defined in claim 1 and wherein said summing circuit comprises two resistance elements.

5. Electric pulse wave clipping circuitry as defined in claim 4 and wherein said resistance elements are of substantially equal value.

6. Electric pulse wave clipping circuitry as defined in claim 1 and incorporating electric connections between said detecting circuits for restoring each other after each pulse has been detected whereby each pulse is clipped in proportion to the amplitude thereof.

7. Electric pulse wave clipping circuitry as defined in claim 4 and incorporating thresholding circuitry interposed between said electric connection from said negative peak detecting circuit to said positive peak detecting circuit.

8. Electric pulse was clipping circuitry as defined in claim 1 and incorporating a further negative peak detecting circuit coupled to said input terminals, a further summing circuit coupled to said positive peak detecting and said further negative peak detecting circuits for determining a maximum threshold level, and an electric connection between said further summing circuit and said negative peak detecting circuit for maintaining the threshold between the positive and negative peaks.

9. Electric pulse wave clipping circuitry as defined in claim 8 and wherein said negative peak and positive peak detecting circuits having predetermined time constants, and said further negative peak detecting circuit has a time constant much greater than the time constants of the first said negative peak and positive peak detecting circuits.

10. Electric pulse wave clipping circuitry as defined in claim 6 and incorporating an automatically variable thresholding circuit interposed in said electric connection between said negative peak detecting circuit and said positive peak detecting circuit for rendering the threshold of the latter a function of the output of the former.

11. Electric pulse wave clipping circuitry, comprising input terminals to which an electric pulse wave signal is applied, output terminals at which a clipped pulse wave signal is desired, a positive peak detecting circuit coupled to said input terminals for determining the positive-most level of said electric pulse wave signal for each pulse, a negative peak detecting circuit coupled to said input terminals for determining the negative-most level of said electric pulse wave signal, resistance elements interconnecting said peak detecting circuits for restoring one in response to the output of the other, a differential amplifier circuit having two input terminals and output terminals connected to said clipping circuitry output terminals, a resistance element coupling the output of said positive peak detecting circuit to one input terminal of said differential amplifier circuit, another resistance element coupling the output of said negative peak detecting circuit to said one terminal, and an electric time delay circuit coupled between said clipping circuitry input terminals and the other input terminal of said differential amplifier circuit.

12. Electric pulse wave clipping circuitry, comprising input terminals to which an electric pulse wave signal is applied, output terminals at which a clipped pulse wave signal is desired, a positive peak detecting circuit coupled to said input terminals for determining the positive-most level of said electric pulse wave signal for each pulse, a negative peak detecting circuit coupled to said input terminals for determining the negative-most level of said electric pulse wave signal for each pulse, resistance elements interconnecting said peak detecting circuits for restoring one in response to the output of the other, a differential amplifier circuit having two input terminals and output terminals connected to said clipping circuitry output terminals, a resistance element coupling the output of said positive peak detecting circuit to one input terminal of said differential amplifier circuit, another resistance element coupling the output of said negative peak detecting circuit to said one terminal, an electric time delay circuit coupled between said clipping circuitry input terminals and the other input terminal of said differential amplifier circuit, another negative peak detecting circuit coupled to said input terminals for determining the negative-most level of said electric pulse wave signal for the train of pulses, a resistive element connected between the outputs of said other negative peak detecting circuit and said positive peak detecting circuit, and a unilateral impedance element connecting an intermediate point on said resistive element and the first said negative peak detecting circuit for imparting a maximum threshold level thereto.

References Cited

UNITED STATES PATENTS

| | | | |
|---|---|---|---|
| 3,011,128 | 11/1961 | Filipowsky | 328—117X |
| 3,076,145 | 1/1963 | Copeland et al. | 328—117X |
| 3,278,851 | 10/1966 | Damon, Jr. et al. | 328—117X |

DONALD D. FORRER, Primary Examiner

J. ZAZWORSKY, Assistant Examiner

U.S. Cl. X.R.

307—235, 237; 328—117, 169

Disclaimer 3,566,281.—*Donald Dennis Baumann*, Los Gatos, Calif. ELECTRIC PULSE WAVE CLIPPING CIRCUITRY. Patent dated Feb. 23, 1971. Disclaimer filed Jan. 20, 1972, by the assignee, *International Business Machines Corporation.*

Hereby enters this disclaimer to claims 1, 2, 3, 4, 5, 7 and 11 of said patent.

[*Official Gazette June 27, 1972.*]